United States Patent
Morman, Jr. et al.

(10) Patent No.: US 7,469,200 B2
(45) Date of Patent: Dec. 23, 2008

(54) METHOD AND APPARATUS FOR PREDICTING BELT SEPARATION FAILURE IN AGING TIRES BY COMPUTER SIMULATION

(75) Inventors: Kenneth Nero Morman, Jr., West Bloomfield, MI (US); Joanna Rakowska, Farmington Hills, MI (US); Sheng-Yuan Hsu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1001 days.

(21) Appl. No.: 10/437,659

(22) Filed: May 14, 2003

(65) Prior Publication Data
US 2004/0230412 A1 Nov. 18, 2004

(51) Int. Cl.
G06F 7/60 (2006.01)
G06F 17/10 (2006.01)
G06F 11/30 (2006.01)
G06F 15/00 (2006.01)
G01N 19/02 (2006.01)

(52) U.S. Cl. .............. 703/2; 703/6; 703/7; 703/8; 73/8; 702/185

(58) Field of Classification Search ............ 703/2, 703/6–8; 73/8; 152/450; 702/179–185
See application file for complete search history.

(56) References Cited

U.S. PATENT DOCUMENTS

| | | | |
|---|---|---|---|
| 5,559,729 A | 9/1996 | Abe | |
| 5,930,155 A | 7/1999 | Tohi et al. | |
| 6,083,268 A * | 7/2000 | Kelsey et al. | 703/7 |
| 6,199,026 B1 | 3/2001 | Shiraishi et al. | |
| 6,338,270 B1 | 1/2002 | Mancosu et al. | |
| 6,741,169 B2 * | 5/2004 | Magiawala et al. | 340/438 |
| 6,813,592 B1 * | 11/2004 | Dhondt | 703/2 |
| 7,016,825 B1 * | 3/2006 | Tryon, III | 703/6 |

OTHER PUBLICATIONS

Dr. Sanjay Govindjee "Firestone Tire Failuire Analysis" Jan. 30, 2001, pp. 1-73.*

Morman, K.N. [1995]: A thermo-mechanical model for amorphous polymers in the glassy, transition, and rubbery regions, *Recent Research in Thermo-mechanics of Polymers in The Rubbery-Glassy Range* (M. Negahban, ed.) *ASME AMD* 203: 89-114.

(Continued)

*Primary Examiner*—Paul Rodriguez
*Assistant Examiner*—Dwin McTaggart Craig
(74) *Attorney, Agent, or Firm*—Dickinson Wright PLLC; Frank MacKenzie

(57) ABSTRACT

A method has been invented for predicting the build-up of heat, material aging, and subsequent belt separation failure in rolling steel-belted pneumatic tires (20). The procedure employs finite element analysis and a new fatigue crack propagation model that takes output generated by the finite element model to predict distance and time to belt separation in the tire. The finite element model uses input information on tire load, speed and inflation pressure (12) to calculate the temperature and energy release rate at the corresponding tips of the fatigue crack to generate four-dimensional response surfaces of crack-tip energy release rate as a function of crack length, crack-tip circumferential angular position, and crack-tip temperature. The fatigue crack propagation model samples the response surface and is numerically integrated to predict distance and/or time to belt separation failure (30).

20 Claims, 5 Drawing Sheets

OTHER PUBLICATIONS

Zhou, J. [1993]: A constitutive model of polymer materials including chemical ageing and mechanical damage and its experimental verification, *Polymer*, 34: 4252-4256.

Morman, K.N., and J.C. Nagtegaal [1983]: Finite element analysis of sinusoidal small-amplitude vibrations in deformed viscoelastic solids, *International Journal of Numerical Methods in Engineering*, 11: 1079-1103 (1983).

Morman, K.M., B.G. Kao and J.C. Nagtegaal [1981]: Finite element analysis of viscoelastic elastomeric structures vibrating about non-linear statically stressed configurations, SAE Paper No. 811309, *Proceedings 4th International Conference on Vehicle Structural Mechanics*, SAE P-99 (1981), pp. 83-92.

Hayashi, S. [1978]: A network theory of nonlinear viscoelasticity, *Polymer Journal*, 18: 59-67.

* cited by examiner

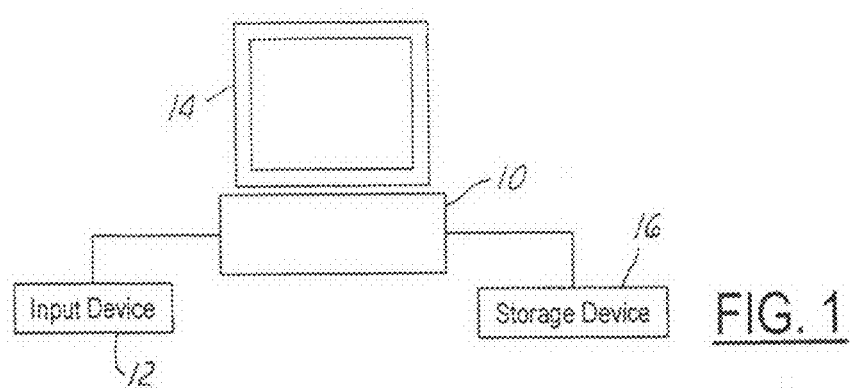
FIG. 1
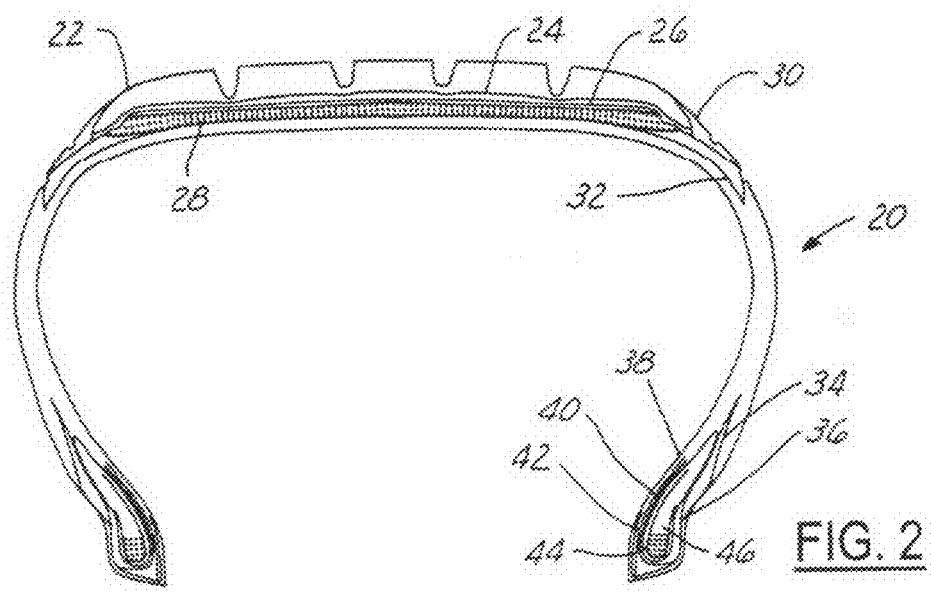
FIG. 2
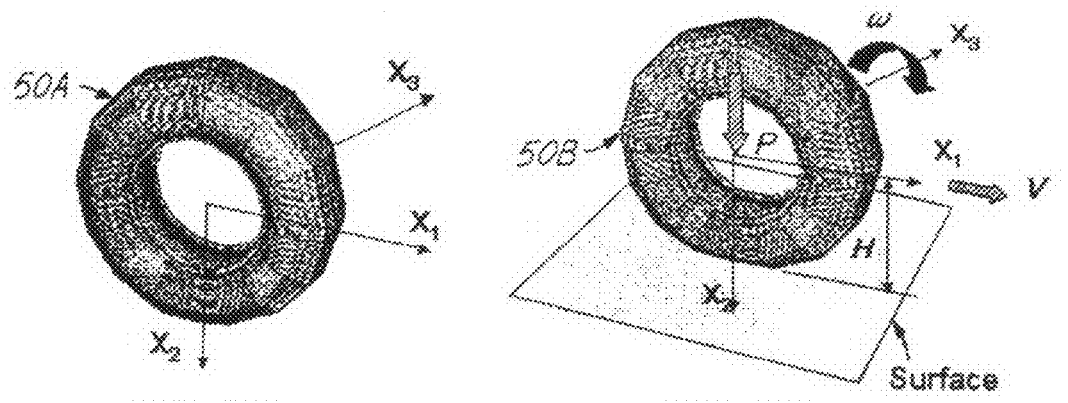
FIG. 3A
FIG. 3B

METHOD AND APPARATUS FOR PREDICTING BELT SEPARATION FAILURE IN AGING TIRES BY COMPUTER SIMULATION

RELATED APPLICATION

The present invention claims priority to provisional application no. 60/366,347 filed on Mar. 21, 2002.

TECHNICAL FIELD

The present invention relates generally to tire modeling for automotive vehicles and, more specifically, to a system for predicting belt separation failure by computer simulation.

BACKGROUND

Aging tires operating at high speeds under conditions of high vehicle loading and under-inflation may be susceptible to a belt-separation failure. Belt separation involves initiation of a crack at the edge of one of the steel belts which then propagates along a path into the belt skim material between belts which may lead ultimately to separation of all or a large portion of the outer belt and tread from the carcass. In the past, the design of pneumatic tires against belt separation was based on the performance of prototype tires on the test track and under accelerated testing conditions in the laboratory. Such development is extremely costly and time consuming and is prone to error. Often, a design change has an effect on other aspects of tire performance. For example, a change intended to improve resistance to belt separation may be found to adversely affect tire rolling resistance. Because of the type testing involved, the discovery may not be made until the tire design was completed and tested.

It would therefore be desirable to model a tire and predict belt separation and readily determine the effects of various design changes on the belt separation prediction.

SUMMARY

The present invention models various design aspects of the tire to predict belt separation.

In one aspect of the invention, determining belt separation in a tire comprises entering a plurality of tire characteristics into a model, entering a plurality of operating conditions into the model, predicting crack growth within the tire in response to the tire characteristics and operating conditions, and generating a distance and elapsed time to separation in response to said crack growth rate and said operating conditions.

In a further aspect of the invention, a system for determining belt separation includes an input device for entering a plurality of tire characteristics into a model and entering a plurality of operating conditions. A display and a controller are also included. The controller is programmed to predict crack growth within the tire in response to the tire characteristics and operating conditions and generate a distance and elapsed time to separation on said display in response to said crack growth rate and the operating conditions.

One advantage of the invention is that cost of developing a tire may be greatly reduced by readily allowing the effect of design changes to be ascertained without building prototypes and mileage accumulation tests.

Other advantages and features of the present invention will become apparent when viewed in light of the detailed description of the preferred embodiment when taken in conjunction with the attached drawings and appended claims.

BRIEF DESCRIPTION OF THE DRAWINGS

The file of this patent contains at least one drawing executed in color. Copies of this patent with color drawings will be provided by the Patent and Trademark Office upon request and payment of the necessary fee.

FIG. 1 is a schematic view of a computer programmed to perform the method according to the present invention.

FIG. 2 is a cross-sectional view of a tire illustrating various materials used in the construction thereof.

FIGS. 3A and 3B are finite element models of a tire according to the present invention.

DETAILED DESCRIPTION

Figure 4:
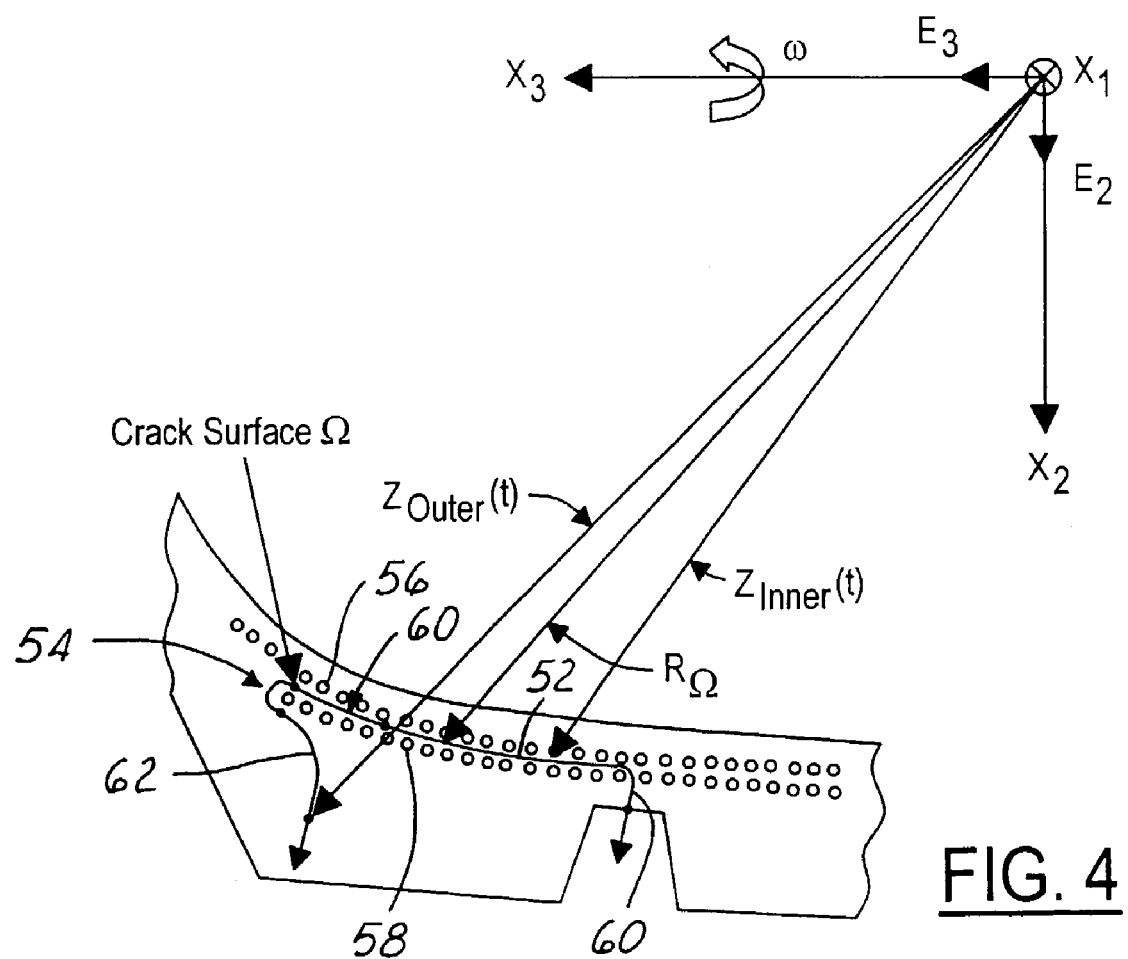
FIG. 4 is a cross-sectional view of a portion of a tire having a crack therein with respect to a Galilean coordinate system.

In the following figures, the same reference numerals will be used to identify the same components.

Referring now to FIG. 1, a computer 10 having an input device 12 such as a keyboard or touch pad is programmed to run the method of predicting tread separation according to the present invention. The computer 10 is coupled to a display device 14 for displaying the various parameters and outputs of the present method. A storage device 16 is also coupled to computer 10. Although storage device is shown as a separate component, it may be integrated into computer 10. Storage device 16 is used to store data from the method of the present invention. Storage device 16 may employ magnetic or optical storage.

Computer 10 has a CPU therein that is programmed to perform the method of the present invention. The method allows the ready understanding of the physical mechanisms involved in belt separation failures and to provide a tool for evaluating tire designs for such failures before prototype build. The method provides a more accurate tire modeling for tread separation in that it accounts for the temperature rise in rolling tires which accelerates tire aging and adversely affects the resistance of the tire construction materials to fatigue propagation and tread separation. The present model is capable of analyzing both real and hypothetical tire designs under different operating conditions from a detailed description of the cross-section geometry specifying those areas with materials of differing mechanical and thermal properties and an accurate description of those properties. Given a set of operating conditions (load, inflation pressure, ambient temperature, etc.) and a steady-state driving cycle (straight line constant speed, constant slip angle, constant camber, etc.) the model is capable of predicting the mechanisms contributing to belt separation including: tire inertia effects; material hysteresis and heat build-up; crack initiation and growth; and tire pressure, loading and rolling speed. The model is sufficiently detailed to distinguish between designs with changes in gross tire geometry, changes in tire materials, or changes in the distribution of tire materials within a given cross section.

The method for evaluating temperature build-up and belt separation failures in rolling steel-belted pneumatic tires employs finite element analysis and a unique fatigue crack propagation model that takes output from a finite element model to predict fatigue crack propagation to belt separation failure in the tire.

Referring now to FIG. 2, the different components of a typical radial tire 20 are illustrated. The tire 20 has a tread 22, a sub-tread 24 positioned radially inward from the tread 22. A cushion 26 is positioned adjacent to belts and belt compound 28. A buttress 30 is positioned at the edge of the tread 22. A shoulder wedge 32 is positioned radially inward from the buttress 30. A rubber chamfer 34 and fabric chamfer 36 are positioned at edge of the sidewall near the rim. A liner 38 is positioned inwardly from the rubber chamfer 34 and fabric chamfer 36. A gum underply 40 and a flipper 42 are positioned adjacent to a bead 44. Bead 44 has bead filler 46 positioned therein. Of course, various constructions of tires may be evident to those skilled in the art.

The rubber is modeled as a temperature-dependent, nearly incompressible, visco-hyperelastic material. The thermal expansion and dissipative properties of the rubber materials are represented by a model as described below.

Referring now to FIGS. 3A and 3B, the finite element models illustrated by 50A and 50B take into consideration the effects of tire rolling inertia and material hysteresis on tire temperature build-up as well as the damage to local tire response due to the presence of propagating cracks. FIG. 3A illustrates a tire at pressure p spinning at constant angular speed ω. The finite element model 50 of FIG. 3B uses input information on tire load, speed and inflation pressure to calculate the distribution of deformations and temperature and the energy release rate T at the tips of a circumferential crack propagating between the No. 1 and 2 belts.

Referring now to FIG. 4, a crack growth sequence leading to belt separation is illustrated by line 52. As mentioned above, line 52 may start in area 54 between a first belt 56 and a second belt 58. In crack portion 60 the crack grows into the belt skim material between the first belt 56 and the second belt 58. At some point the crack 52 starts propagating toward the surface such as that shown in areas 60 and 62. This is due to some critical length of the crack and various other factors. As the crack propagates into areas 60 and 62, partial or complete separation of the second belt 58 and the tread from the tire carcass occurs.

The kinematic variables of the crack surface $\Omega_t$ and the crack tip are illustrated in a Galilean coordinate system $E_A$. The distance is represented by $Z(\phi, t)$ and the radius from the center of the coordinate system.

The output from the finite element analysis is used to construct response surfaces of crack-tip tearing energy (energy release rate) and temperature as functions of: crack size; and tire load, speed and inflation pressure. A fatigue crack propagation model to predict distance and time to belt separation uses the response surfaces of energy release rate T versus crack length generated by the finite element model of the rolling tire.

Figure 5:
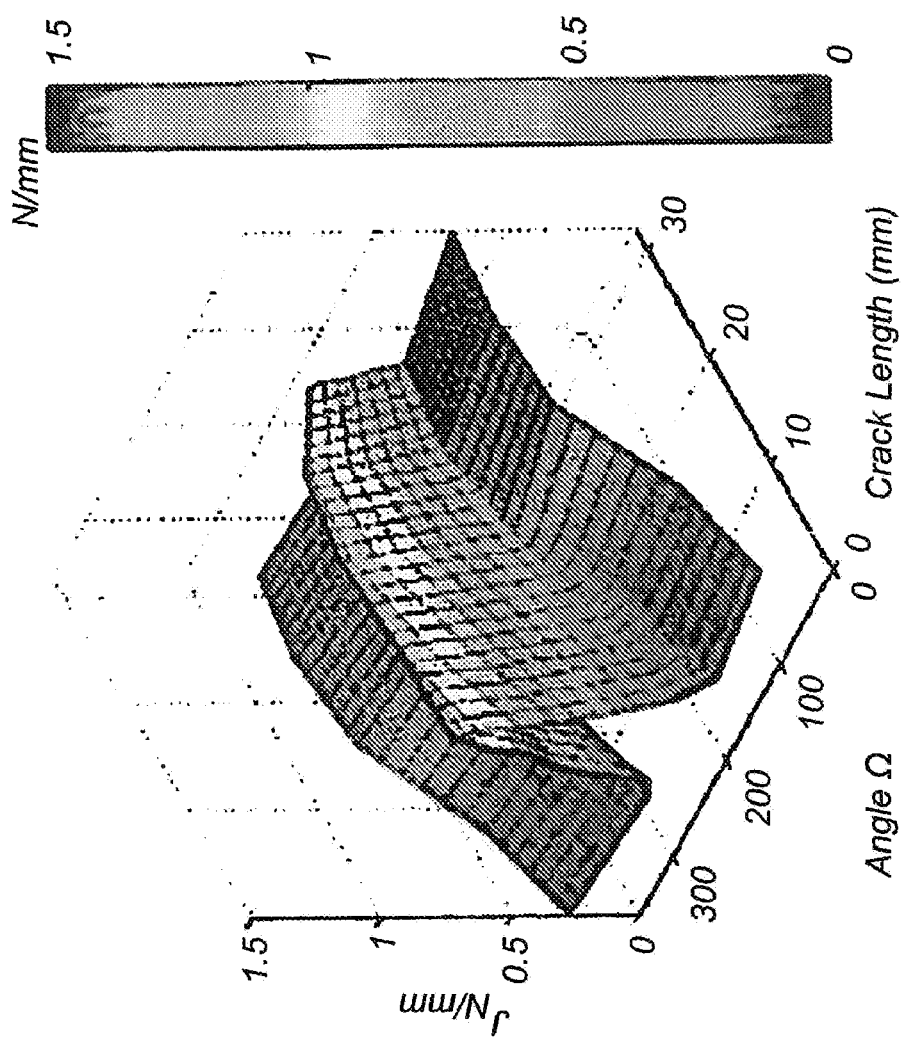
FIG. 5 is a finite element analysis plot of the energy release rate T at the inner crack tip as a function of length and angular position.
Figure 5:
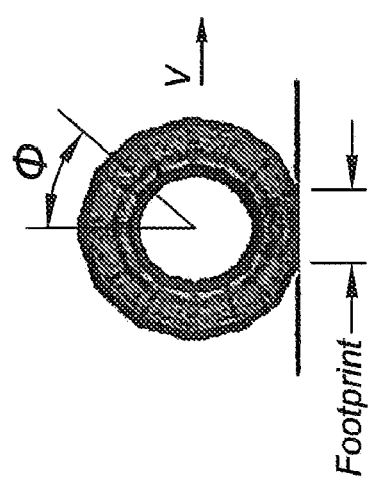

Referring now to FIG. 5, the response surface for the energy release rate at the inner crack tip as a function of crack length and circumferential angular position for a tire rolling at 60 mph, inflated at 26 psi and 1357 lbs load is illustrated.

Figure 6A:
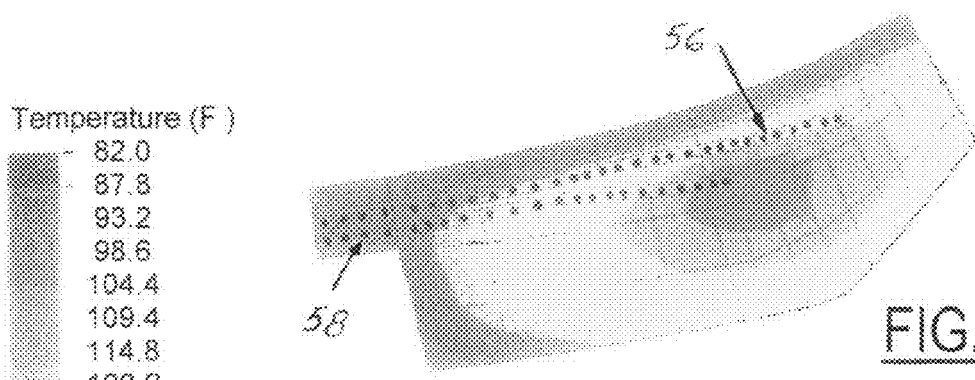
FIGS. 6A and 6B are plots of the distribution of temperature in a tire calculated according to the present invention.
Figure 6B:
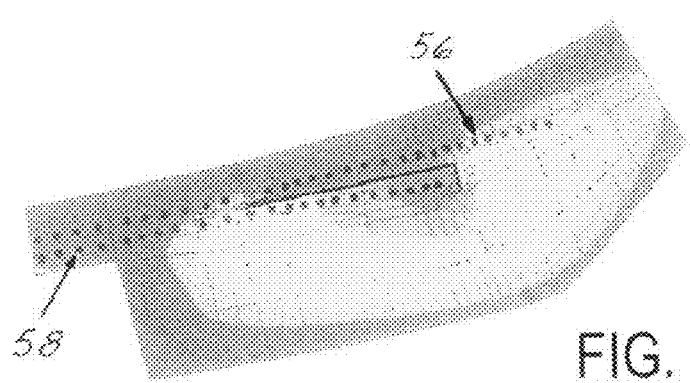

FIGS. 6A and 6B illustrate how the temperature is redistributed locally due to the presence of a crack, as predicted by the rolling tire model.

Figure 7:
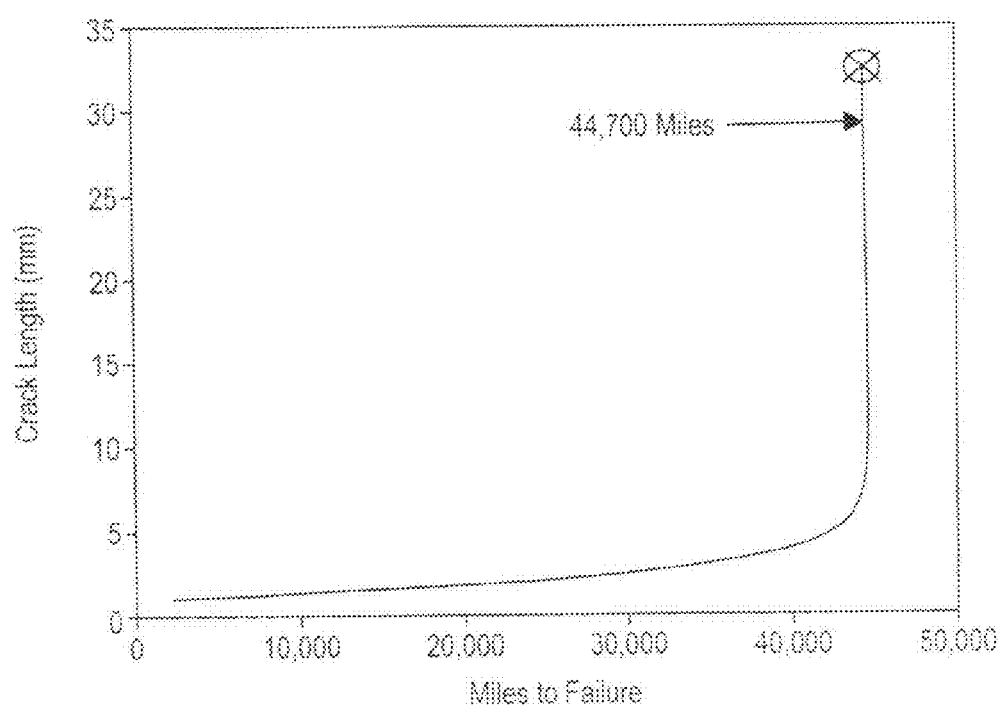
FIG. 7 is a plot of crack length versus miles to failure generated according to the present invention.

FIG. 7 shows a typical fatigue crack model prediction of distance-to-failure as will be further described below.

Figure 8:
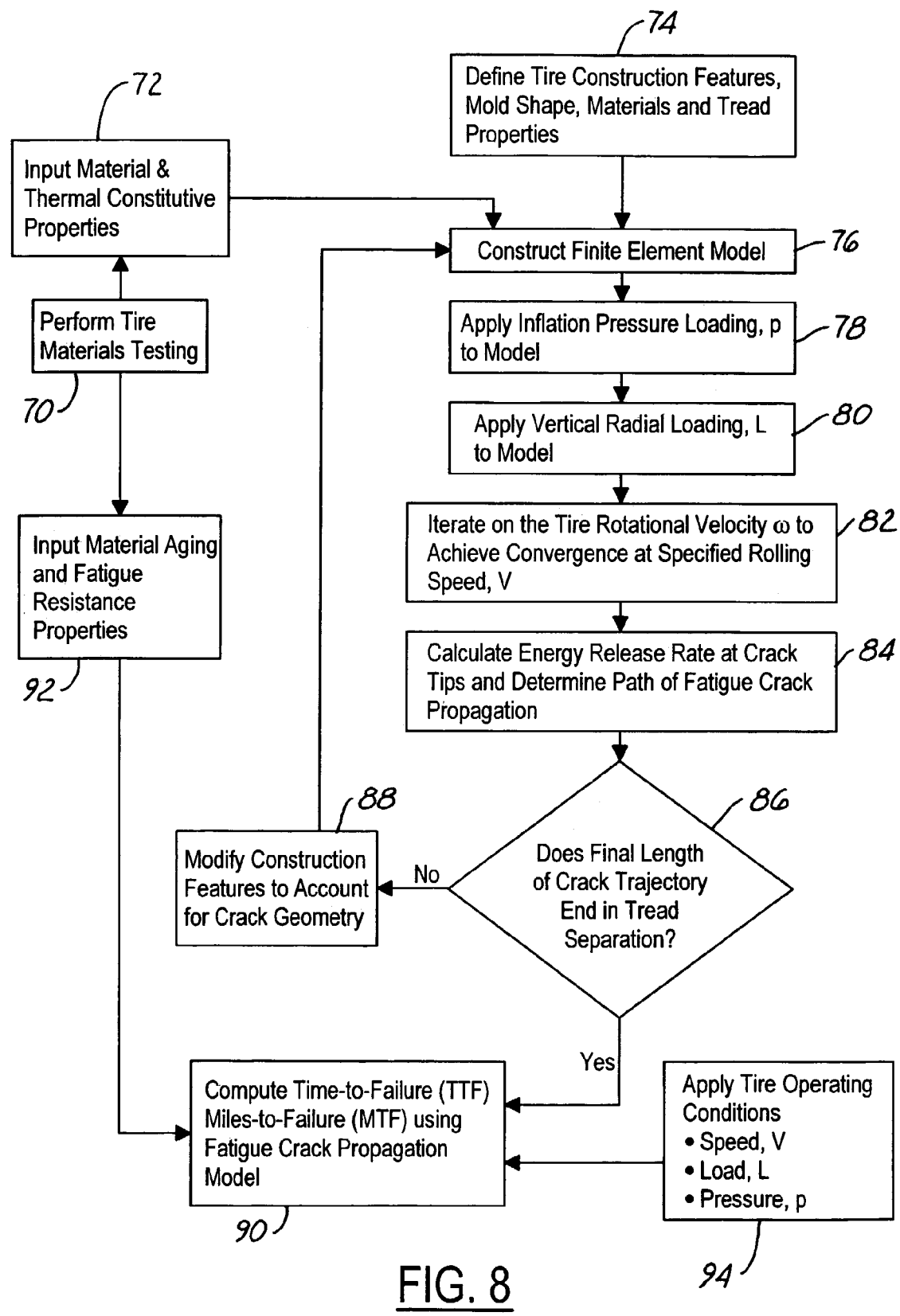
FIG. 8 is a flow chart illustrating the method for operating the present invention.

Referring now to FIG. 8, the method to determine convergence on a crack propagation trajectory is illustrated. In step 70 materials testing of the tire may be performed. This testing will generate various characteristics of the materials. Of course, if the characteristic for the particular compound or blend of materials is known, those may be used and not tested. In step 72 the material and thermal constitutive properties are input to the system. In step 84 the tire construction features, mold shape, materials and tread properties are input to the model. In step 76 a finite element tire model is determined. In step 78 inflation pressure loading P is applied to the model. In step 80 vertical radial loading L is applied to the model. In step 82 the tire rotational velocity Ω is iterated to achieve convergence at a specified rolling speed. In step 84 the energy release rate at the crack tips and a path is determined for fatigue crack propagation. In step 86 if the final length of the crack does not end in tread separation, step 88 is executed in which the construction features to account for track geometry are modified. After step 88 step 76 is again performed. Referring back to step 86, if the length of the crack ends in a tread separation step 90 is performed. In step 90 the time to failure or miles to failure using the fatigue crack propagation model are determined. Of course, input from step 92 for material aging and fatigue resistance properties are used. These properties may be attained using the tire materials testing of step 70. Also in step 90, various operating conditions are factored into the time to failure and miles to failure model. For example, speed, load and pressure as illustrated by step 94 may also be factored into step 90.

Details of step 84 are provided for by the model for two-dimensional circumferential crack growth in tires as follows:

$$\frac{da}{dN} = \frac{\beta(T_{eff}^2 + \Delta T^2)}{2\pi R_c[\{\mu T_c(\nu) - T_{max}\} + \Delta T]} \tag{1}$$

where a=crack length, meters

ν=material crosslink density, g-moles/m$^3$ $R_c$=radial location of the crack circumferential crack tip, meters β=coefficient of energy dissipation, m$^4$/kJ-cycle μ=the damage evolution coefficient T=tearing energy or energy release rate, kJ/m$^2$ $T_{eff}$=effective or mean tearing energy over the interval [0, 2π]

$T_{max}$=maximum value of tearing energy over the interval [0, 2π]

$\Delta T = T_{max} - T_{eff}$ $T_c$=critical value of tearing energy at time t, kJ/m$^2$ N=number of cycles of tire revolution The necessary condition for catastrophic crack growth rate is:

$$[(\mu T_c(\nu) - T_{max}) + \Delta T] \leq 0. \tag{2}$$

The model parameters β and μ are determined from fatigue crack propagation tests on specimens of the tire construction materials of step 70. The decay in the critical energy release rate $T_c(\nu)$, which accounts for chemical aging effects, is calculated by an equation governing the evolution of critical energy release with material crosslink density ν(t).

The critical energy release rate $T_c(\nu)$ is related to the current material cross-link density ν by the relation $$T_c(\nu) = H(\nu(t)). \tag{3}$$

The cross-link density ν is given by:

$$\nu = \frac{\nu_m + B\exp[-\beta_1(\theta(t))]}{1 + CB\exp[-\beta_1(\theta(t))]} \quad (4)$$

Here A and C are material constants, and $\nu_m$ is the maximum crosslink density that the material can reach and $$B = \frac{\nu_m - \nu_0}{1 + C\nu_0} \quad (5)$$

$$\nu_o = \nu|_{t=0},$$

$$\beta_1 = \frac{Ak_B(1 + C\nu_m)}{h}\int_0^t \theta(\tau)\exp\left[-\frac{E_c}{k_B\theta(\tau)}\right]d\tau. \quad (6)$$

where $E_c$ is activation energy, $k_B$ is the Boltzmann constant h is Planck's constant, and θ is absolute temperature. The model parameters A, C, $E_c$, $\nu_m$ and H(ν) are determined by material testing.

By incorporating equations (3) and (4) into (1), the fatigue crack propagation model accounts for the degradation in tire material strength properties due to aging in the prediction of distance and/or time to belt separation failure as shown on FIG. 7.

The analysis process flow in FIG. 8 shows that an appropriate failure analysis for any of various tire design configurations and materials operating under a combination of conditions of speed, inflation pressure, load and ambient temperature can be undertaken and iterated to convergence such that the distance and time to belt separation failure can be estimated. Improvement of resistance to belt separation failure can thus be easily attained.

While particular embodiments of the invention have been shown and described, numerous variations and alternate embodiments will occur to those skilled in the art. Accordingly, it is intended that the invention be limited only in terms of the appended claims.

What is claimed is:

1. A method of determining belt separation in a tire comprising:
   entering a plurality of tire characteristics into a model;
   entering a plurality of operating characteristics into the model;
   predicting crack growth within the tire in response to the tire characteristics and operating characteristics; and
   generating a distance to separation in response to said crack growth rate and said operating characteristics.

2. A method as recited in claim 1 further comprising generating a time to separation in response to said crack growth rate and said operating characteristics.

3. A method as recited in claim 1 wherein predicting crack growth comprises determining an energy release rate.

4. A method as recited in claim 1 wherein the operating characteristics include load.

5. A method as recited in claim 1 wherein the operating characteristics include speed.

6. A method as recited in claim 1 wherein the operating characteristics include tire pressure.

7. A method as recited in claim 1 wherein the tire construction features include mold shape.

8. A method as recited in claim 1 wherein the tire construction features include tread properties.

9. A method as recited in claim 1 wherein the tire construction features include tire materials.

10. A method of determining belt separation in a tire comprising:
    forming a finite element tire model in response to a tire construction features;
    applying pressure loading to the model;
    applying radial loading to the model;
    applying a rotational speed to the model;
    determining an energy release rate at a fatigue crack tip;
    determining a path of fatigue propagation in response to the energy release; and
    determining a time or distance until tread failure in response to the fatigue propagation.

11. A method as recited in claim 10 wherein the tire construction features include mold shape.

12. A method as recited in claim 10 wherein the tire construction features include tread properties.

13. A method as recited in claim 10 wherein the tire construction features include tire materials.

14. A method as recited in claim 10 wherein the operating characteristics include load.

15. A method as recited in claim 10 wherein the operating characteristics include speed.

16. A method as recited in claim 10 wherein the operating characteristics include tire pressure.

17. A system for determining belt separation comprising:
    an input device for entering a plurality of tire characteristics into a model and entering a plurality of operating characteristics;
    a display; and
    a controller programmed to predict crack growth within the tire in response to the tire characteristics and operating characteristics and generate a distance to separation on said display in response to said crack growth rate and said operating characteristics.

18. A system as recited in claim 17 wherein the tire characteristics include mold shape.

19. A system as recited in claim 17 wherein the tire characteristics tread properties.

20. A system as recited in claim 17 wherein the tire characteristics tire materials.

* * * * *